(12) United States Patent
Hajnal et al.

(10) Patent No.: US 6,396,269 B1
(45) Date of Patent: May 28, 2002

(54) MAGNETIC RESONANCE IMAGING

(75) Inventors: Joseph Vilmos Hajnal; David James Larkman, both of London (GB)

(73) Assignee: Marconi Medical Systems, Inc., Cleveland, OH (US)

( * ) Notice: Subject to any disclaimer, the term of this patent is extended or adjusted under 35 U.S.C. 154(b) by 0 days.

(21) Appl. No.: 09/713,716

(22) Filed: Nov. 15, 2000

(30) Foreign Application Priority Data

Nov. 15, 1999 (GB) ............................................. 9926918

(51) Int. Cl.⁷ ................................................. G01V 3/00
(52) U.S. Cl. ........................................ 324/307; 324/309
(58) Field of Search ................................ 324/309, 307, 324/306, 318, 322

(56) References Cited

U.S. PATENT DOCUMENTS 5,600,244 A * 2/1997 Jensen et al. ............... 324/309
6,242,916 B1 * 6/2001 King ........................... 324/309

FOREIGN PATENT DOCUMENTS

WO     WO 99/54746     10/1999

* cited by examiner

*Primary Examiner*—Louis Arana
(74) *Attorney, Agent, or Firm*—John J. Fry; Thomas M. Lundin

(57) ABSTRACT

In magnetic resonance imaging apparatus employing magnetic gradient fields in a phase-encode and in a read-out direction for spatially encoding excited MR active nuclei in a region of interest of a patient, in which a reduced number of readings in the read-out direction is taken, thereby creating an aliased reduced field of view image, at least two r.f. receive coils are used together with sensitivity information concerning those coils in order to unfold the aliased image to produce a full image while taking advantage of the reduced time of collection of data. In accordance with the invention, sensitivity information is collected at a lower resolution than that at which the image information is collected.

14 Claims, 4 Drawing Sheets

MAGNETIC RESONANCE IMAGING

BACKGROUND

This invention relates to magnetic resonance (MR) imaging.

The invention is particularly concerned with reduction in the time needed to collect data for imaging a region of interest of a patient.

For example, it is sometimes desired to view the progress of a contrast agent in the bloodstream through a region, in order to help distinguish between benign tumour, malignant tumour and unaffected tissue, and rapid imaging is required to monitor the flow of contrast agent to the various sites. A malignant tumour may require a greater supply of blood and could show up in this way.

A prior art magnetic resonance imaging apparatus is shown in FIG. 1. A patient 1 (shown in section) is slid axially into the bore 2 of a superconducting magnet 3, and the main magnetic field is set up along the axis of the bore, termed by convention the Z-direction. Magnetic field gradients are set up, for example, in the Z-direction, to confine the excitation of magnetic resonant (MR) active nuclei (typically hydrogen protons in water and fat tissue) to a particular slice in the Z-direction e.g. that illustrated in FIG. 1 and, in the horizontal X and the vertical Y directions as seen in FIG. 1, to encode the resonant MR nuclei in the plane of the slice. An r.f. transmit coil (not shown) applies an excitation pulse to excite the protons to resonance, and a pair of r.f. receive coils 4, 5 pick up relaxation signals emitted by the disturbed protons.

To encode/decode received signals in the Y-direction, the signals are detected in the presence of a magnetic field gradient, termed a read-out gradient, to enable different positions of relaxing nuclei to correspond to different precession frequencies of those nuclei about the direction of the main magnetic field due to the influence of the gradient. The data is digitised, and so for each r.f. excitation pulse, a series of digital data points are collected, and these are mapped into a spatial frequency domain known as K-space (FIG. 2). Each r.f. pulse permits at least one column of digital data points to be collected.

To encode/decode the received signals in the X-direction, after each r.f. pulse has been transmitted and before data is collected with the read-out gradient applied, a magnetic field gradient in the X-direction is turned on and off. This is done for a series of magnitudes of magnetic field gradients in the X-direction, one r.f. pulse typically corresponding to a different magnitude of gradient in the X-direction.

On the K-space matrix shown in FIG. 2, the columns of data points correspond to r.f. pulses followed by different magnitudes of phase-encode gradients.

The field of view imaged by the magnetic resonance imaging apparatus depends on the spacing of the data points in the phase-encode and read-out directions, and the resolution of the image depends on how far the points extend in each direction e.g. how large the maximum phase-encode gradient is.

The signals received from the r.f. receiver coils 4, 5 are subject to a two dimensional fast Fourier Transform in Fourier Transform processors 6, 7, to produce pixelated images which are stored in image memories 8, 9.

A slice image is shown in FIG. 3. For the purposes of explanation, the symbols of a circle, a square and a triangle have been illustrated in both the object 2 and the image in FIG. 3. FIG. 3 implies that the spacing of data points in the phase-encode gradient direction is sufficient to image the whole of the slice shown in FIG. 1.

Between each r.f. pulse, there is a certain minimum pulse repetition time, and the collection of data implied by FIGS. 2 and 3 may therefore take too long to permit flows of contrast agent to be adequately monitored.

One technique used to reduce the data collection time is to cut out, say, half the phase-encode steps e.g. by keeping the same maximum phase-encode gradient but omitting every other column of data. This would then halve the data collection time.

The spacing of the data points in the phase-encode direction would now have doubled, so that the field of view in the corresponding image domain would have halved. (The field of view in the read-out direction would remain the same because the number of data points collected during read-out would remain the same.) The imaged area would now cover little more than the square illustrated in FIG. 1. This is shown in FIG. 4. Unfortunately, MR signals from the circle and the triangle would still be picked up by each receive coil 4, 5, and the processing is such that these regions would be folded back over the square, with the circle and the triangle being interposed. This is a problem known as aliasing. Separate points $P_1$, $P_2$ in the object would be imaged at the same pixel in FIG. 4.

It is to enable the aliased image to be unfolded that two receive coils 4, 5 have been used. (Magnetic Resonance in Medicine 42:952–962 (1999)—SENSE: Sensitivity Encoding For Fast MRI by Klaas P Pruessmann, Markus Weiger, Markus B Scheidegger and Peter Boesiger). With the two receive coils and suitable processing, the benefit of a halved data collection time can be retained, but the image can be unfolded. This technique is referred to as SENSE (sensitivity encoding).

The response of coil 4 to MR signals from point $P_1$ is perhaps greater than its response to MR signals emanating from point $P_2$, and the position is perhaps the other way round with regard to the coil 5. Knowledge of the relative sensitivities of the coils 4, 5 can be used in the processor 10 to unfold the aliased image of FIG. 4 into an image having the pattern of FIG. 3, although with a lower signal-to-noise ratio because only half the data has been collected.

For example, coil 4 receives MR signals from both points $P_1$ and $P_2$, and the combined intensity of the resulting pixel stored in image memory 8 ($C_1$) depends on the sensitivity of the coil 4 to point $P_1$ ($S_{11}$) and the sensitivity of the coil 4 to point $P_2$ ($S_{12}$). The image memory 9 also has an intensity stored ($C_2$) corresponding to points $P_1$ and $P_2$ which depends on the sensitivity of coil 5 to $P_1$ ($S_{21}$) and on its sensitivity to $P_2$ ($S_{22}$). Thus, $$C_1 = S_{11}P_1 + S_{12}P_2$$

$$C_2 = S_{21}P_1 + S_{22}P_2$$

More generally $$(C) = (S).(P)$$

where (C), (S) and (P) are matrices.

Provided the sensitivity terms are known, the intensity corresponding to each pixel $P_1$ and $P_2$ separately can be calculated in processor 10, for each pair of points of the image which are mapped onto the same pixel in the aliased image. The aliased image can then be unfolded and viewed in full on display 11.

To calibrate the coils 4, 5 requires a knowledge of the sensitivity of each coil at each point. Of course, the data collected at each image memory 8, 9 maps the sensitivity of each coil 4, 5 onto each pixel, but in a way which is clearly weighted by the intensity produced by each point of the object.

The paper referred to suggests collecting the sensitivity data using a third receive coil, in the form of a body coil, which has a uniform sensitivity over each part of the object.

To suppress the weighting produced by the object being imaged, it turns out that the lines of the images in the image memories 8, 9 have to be divided by corresponding lines i.e. for the same point in K-space in the read-out direction, produced by the imaging with the body coil.

However, for example, in the case of an object with the weighting shown in FIG. 5, the sensitivity profile for the coil 4 could be as shown in FIG. 6 and that for the body coil as shown in FIG. 7. FIG. 8 shows the division of one by the other and the presence of noise.

This is because the body coil picks up noise from the whole of the section of the body being imaged, and the resulting sensitivity profile produced by the division, for each line of the image, is masked by noise.

To overcome this, the paper referred to proposes to divide the response of one coil 4 (FIG. 9) by the response of the other coil 5 (FIG. 10) and to dispense with the body coil altogether, for each line of the image. This is possible because it turns out that the (S) matrix terms only require this ratio to suppress the weighting effect of the object and the correction for the relative sensitivities produced by the two coils.

There is now less noise in the resultant division (FIG. 11) but a problem arises which is also inherent in the ratio shown in FIG. 8 i.e. that the ratio of sensitivities is only present where the object is present. Noise is still present, but to a lesser extent, and postprocessing therefore has to be carried out to reduce the noise. The problem is that, in so-doing, a postprocessing algorithm has to be employed which prevents similar sharp edges in the edges of the object itself being smoothed.

SUMMARY

The invention provides apparatus for magnetic resonance imaging, comprising means for creating magnetic field gradients in a phase-encode direction for spatially encoding excited MR active nuclei in a region of interest of a patient, means for receiving r.f. signals from the excited MR active nuclei, means for processing the spatially encoded r.f. receive signals to produce a spatial representation of the region of interest, the magnetic field gradient means being arranged to create a number of phase-encode gradients corresponding to a smaller field of view than the region of interest, the r.f. receive means including a pair of receive coils and processing means arranged to use the r.f. signals received from each coil together with sensitivity information for the coils to produce an unfolded version of the aliased data corresponding to the reduced field of view, wherein the sensitivity information used is arranged to be collected at reduced resolution compared to that at which the image is collected.

By collecting the sensitivity information at a lower resolution, it become unnecessary to fit or smooth the sensitivity information removed of its object weighting.

The sensitivity information may be collected by ratioing each of the receive coils with a body coil, or by ratioing the sensitivities of the two r.f. receive coils themselves. These may be of the loop and butterfly type as claimed in our co-pending patent application Ser. No. 09/713,646, but could be a pair of loops or any other types. Further, further pairs of loops may be provided.

DRAWINGS

Ways of carrying out the invention will now be described in greater detail, by way of example, with reference to the accompanying drawings, in which.

DESCRIPTION

Figure 1:
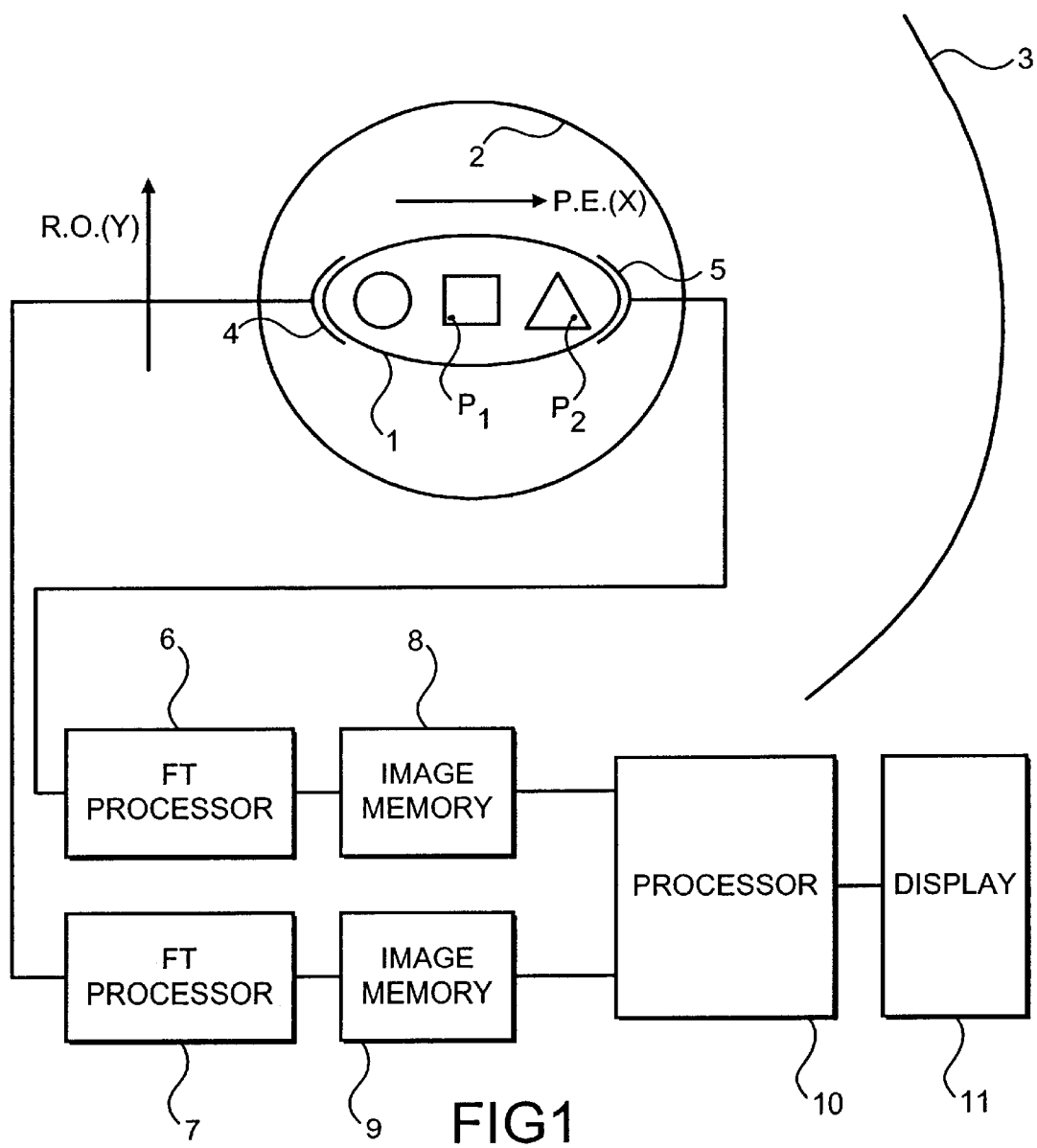
FIG. 1 is a partly axial sectional, partly block diagram representation, of prior art magnetic resonance imaging apparatus.
Figure 2:
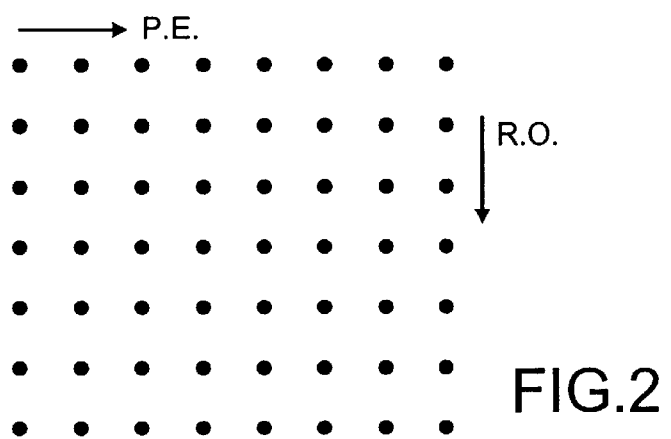
FIG. 2 is a representation of the data in K-space resulting from the signal picked up by each receive coil of the apparatus.
Figure 3:
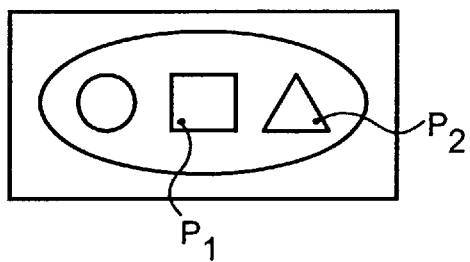
FIG. 3 is a representation of the image area which would be built up if a full number of phase-encode gradients were performed.
Figure 4:
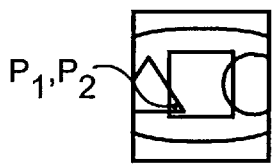
FIG. 4 is an image which would be built up if a reduced number of phase-encode gradients were to be performed.
Figure 5:
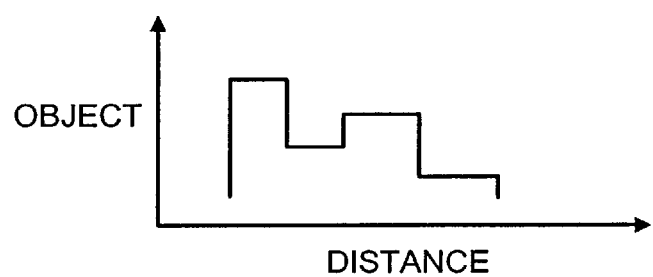
FIG. 5 represents the object weighting of a line in the image memory 8, 9.

In accordance with the invention (FIG. 12), reference data is collected at reduced resolution compared to that used during imaging. The reference data is of course collected at full field of view. Lower maximum values of phase-encode gradient are used. The effect of lower resolution in the reference data, used to calibrate the sensitivity of the coils 4, 5 is to reduce noise in the reference data. The reference data, which is stored in memory 12, is used in the SENSE method to unfold the aliased data of FIG. 4. Because the noise is reduced in the reference data, the signal-to-noise of the target unfolded SENSE data, is increased.

Figure 6:
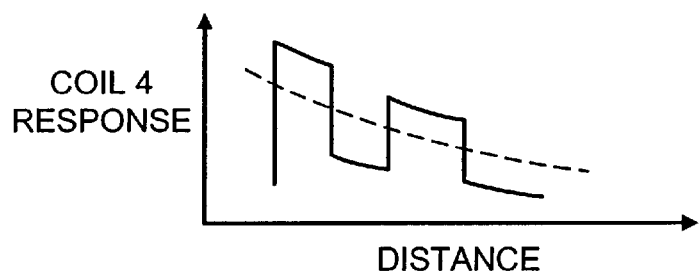
FIG. 6 represents the object weighted sensitivity of coil 4 for a line in the image memory 9.
Figure 7:
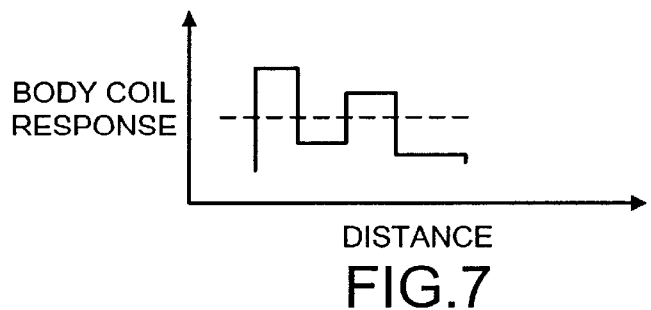
FIG. 7 represents the object weighted sensitivity of a body coil for an equivalent line in an image memory connected to the body coil.
Figure 8:
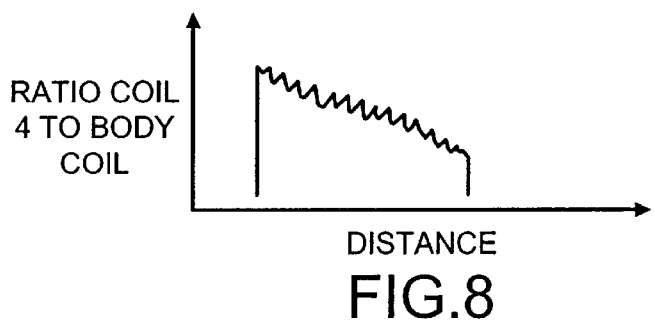
FIG. 8 represents the ratio of the object weighted sensitivities shown in FIGS. 6 and 7.
Figure 9:
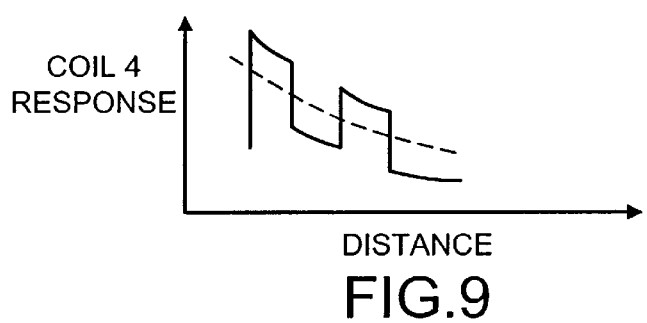
FIG. 9 represents the object weighted sensitivity of coil 4 for a line in image memory 9.
Figure 10:
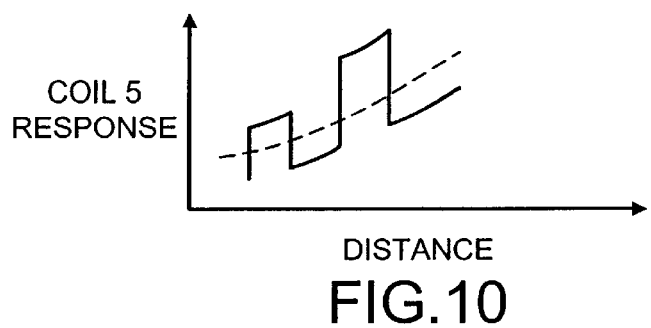
FIG. 10 represents the object weighted sensitivity of coil 5 for a line in image memory 8.
Figure 11:
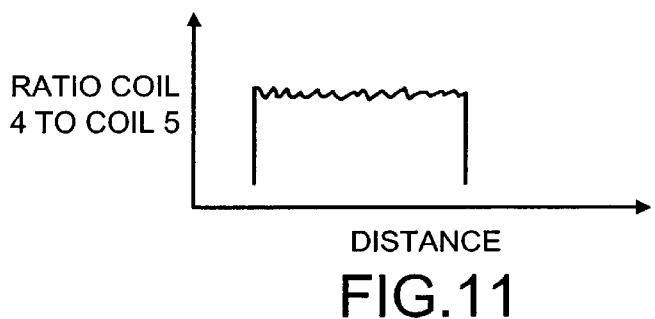
FIG. 11 represents the ratio of the object weighted sensitivities shown in FIGS. 9 and 10.

Various arrangements may be used. One pair of coils 4, 5 may be used. A loop, butterfly combination as claimed in our co-pending application Ser. No. 09/713,646 may be used. More than one pair of coils may be used. In each case, the reference data may be produced using a body coil as in FIGS. 6 to 8, or a body coil may be omitted, as in FIGS. 9 to 11.

To go now into the background of the invention in greater detail, dynamic enhanced MR mammography (DMRM) is a leading imaging method for identifying breast cancer in patients with dense breast tissue. Differentiation of malignant from benign disease is critically dependent on contrast enhancement profiles: cancers enhance the most briskly with peak enhancements at a maximum of two minutes. Current screening techniques rely on coverage of both breasts using volume acquisitions following bolus injection of Gadolinium-DTPA. The requirements for large field of view (FoV) at millimeter resolution with adequate temporal resolution are challenging.

Figure 12:
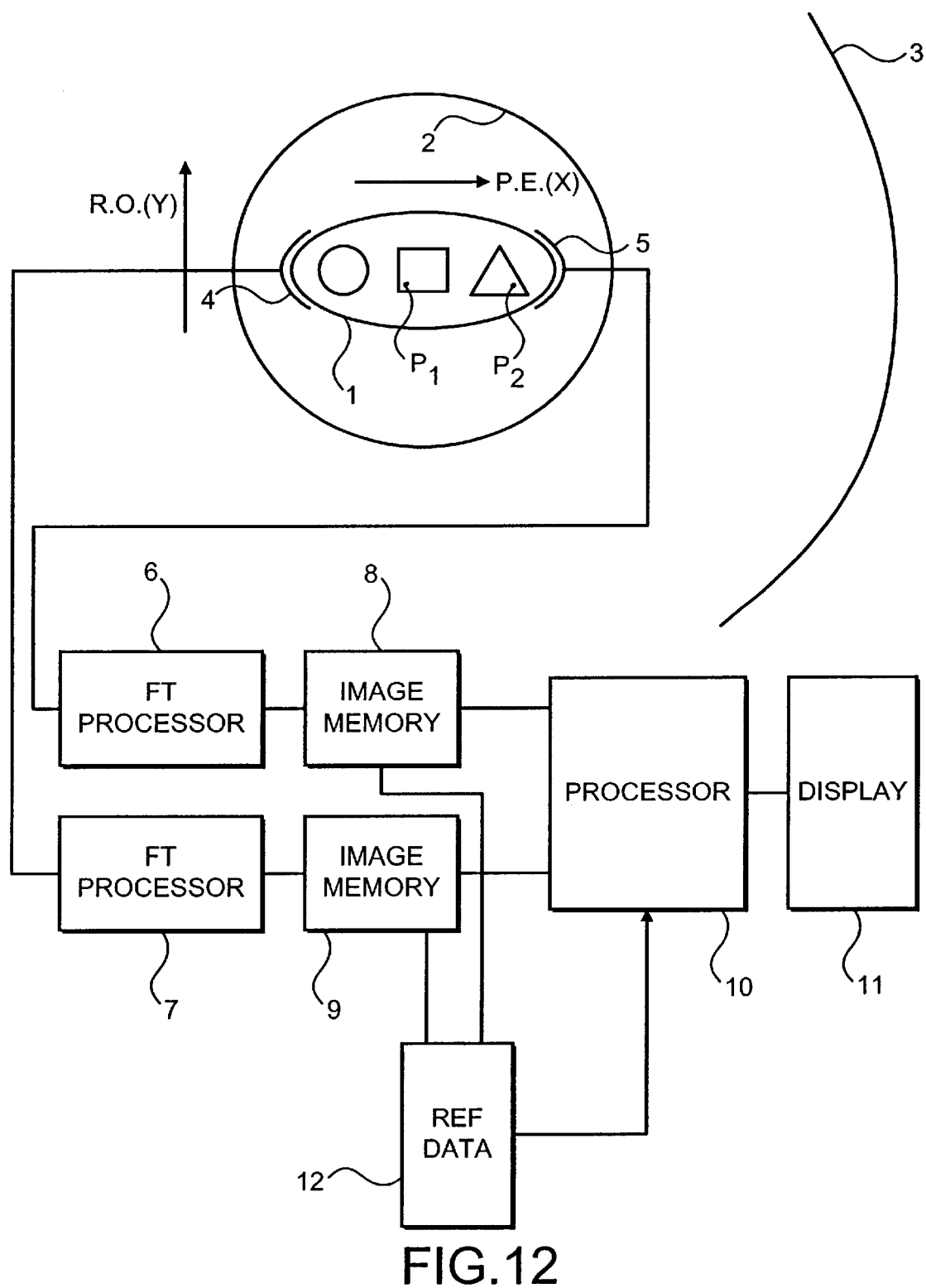
FIG. 12 is a partly axial sectional, partly block diagram representation, of magnetic resonance imaging apparatus according to the invention.

Sensitivity encoding SENSE requires an array coil with coil elements that have spatially distinct sensitivity profiles over the region of interest. A 4 channel receive only array coil with two pairs of nominally orthogonal coils is used, each pair providing approximately uniform sensitivity over one breast. Only one pair of coils is shown in FIG. 12. The dynamic examination consisted of full resolution volume scans with the phase encoded, left-right FoV reduced by two as explained in our co-pending patent application Ser. No. 09/713,646. The resulting degeneracy is unfolded using sensitivity data from the coils.

To avoid misalignment between reference and target data and changes in coil loading, sensitivity data is acquired with the subject in situ. This data is contaminated by a dependence on tissue signals, which can be removed by normalising using anatomical images that are assumed to be free of sensitivity variations. Alternatively, the approach used here uses the relative sensitivities of the coils in the array. In either case the sensitivity data requires a high signal-to-noise ratio (SNR) to avoid compromising the SNR of the final data. Filtering the sensitivity data can increase SNR. Artefacts in the sensitivity measurements from cardiac or respiratory motion are a critical issue in the current application. Non-localised artefacts tend to mask the spatial properties of the coils.

To provide high SNR reference data that is robust against physiological motion we have reduced the resolution of the full FoV reference acquisitions, but maintained approximately constant imaging time by multiple averaging. This reverses the order of the normalisation and filtering steps, leaving the coil profile intact provided the reference data has sufficient spatial frequency content.

In one embodiment, all data was acquired on a 0.5T Picker Apollo scanner (Cleveland, Ohio) using a 3D gradient echo sequence (TR/TE 10/3.75) to image a region 30×30×18 cm$^3$. Coil sensitivity information was obtained with a matrix of 64×32×50, 10NEX and was zero filled to 256×256×50 prior to reconstruction. Dynamic data was acquired in 10 frames, each with half left-right FoV and a rectangular matrix of 256×128×50, 1NEX (40s per frame). The data were reconstructed and unfolded onto a full FoV, 256×56×50 matrix. Unfolding was performed pair wise for the two symmetrical left-right coil combinations. The final images were then added in quadrature. Image manipulation employed IDL (Research Systems, Colorado).

The method was tested on phantoms, two normal volunteers without contrast, and one normal volunteer with contrast. Reference data acquired at full resolution with a single average and reduced resolution with multiple averages were collected and compared for SENSE processing. Reduced FoV SENSE processed data and full FoV standard images were obtained using the same acquisition. Images were assessed for anatomical detail, artefacts and sensitivity to contrast uptake.

Use of full resolution single average reference data resulted in errors in the unfolding associated with cardiac and respiratory motion. The use of low resolution, multiply averaged reference data eliminated this problem to produce artefact free unfolded images with no detectable loss of resolution.

In this embodiment, an application of SENSE increases the temporal resolution of DMRM by a factor of two. The method has been shown to have sufficient sensitivity and immunity from artefacts for detecting enhancement in normal tissue with a temporal resolution well suited for pathological uptake.

While the magnet has been described as a superconducting magnet, it could be a resistive magnet, and need not be of the annular configuration but could be an open C or H configuration, and indeed, permanent magnets could be used.

The invention has been described with reference to the preferred embodiment. Obviously, modifications and alterations will occur to others upon reading and understanding the preceding description. It is intended that the invention be construed as including all such modifications and alterations insofar as they come within the scope of the appended claims or the equivalents thereof.

What is claimed is:

1. An apparatus for magnetic resonance imaging, comprising:

means for generating a main magnetic field in an examination region;

means for generating magnetic field gradients for spatially encoding MR active nuclei in a patient, the magnetic field gradient means being arranged to generate a plurality of phase-encode gradients corresponding to a smaller field of view than a region of interest within the examination region and resulting in an aliased image of the region of interest;

means for exciting the spatially encoded MR active nuclei;

means for receiving r.f. signals from the excited MR active nuclei, the r.f. receive means comprising a first r.f. receive coil and a second r.f. receive coil; and means for processing the spatially encoded r.f. receive signals to produce a spatial representation of the region of interest, the processing means arranged to use the r.f. signals received from the first and second r.f. receive coils together with sensitivity information for the first and second r.f. receive coils to produce an unfolded image of the aliased image, wherein the sensitivity information used is arranged to be collected at reduced resolution compared to that at which the image is collected.

2. An apparatus as claimed in claim 1, in which the sensitivity information of the first and second r.f. receive coils is produced using a lower value of maximum phase-encode gradient than that used for collecting the image information.

3. An apparatus as claimed in claim 1, in which the sensitivity information of the first and second r.f. receive coils is collected a plurality of times and averaged.

4. An apparatus as claimed in claim 1, in which the sensitivity information is obtained by ratioing the sensitivities of the first and second r.f. receive coils.

5. An apparatus as claimed in claim 4, in which the first r.f receive coil is a loop coil and the second r.f. receive coil is a butterfly coil.

6. An apparatus as claimed in claim 4, in which the first r.f. receive coil is a body coil.

7. An apparatus as claimed in claim 4, in which the first and second r.f. receive coils are disposed at opposite sides of the examination region from one another.

8. A method of magnetic resonance imaging, comprising:

generating a main magnetic field in an examination region;

generating magnetic field gradients for spatially encoding MR active nuclei in a patient, the magnetic field gradients including a plurality of phase-encode gradients corresponding to a smaller field of view than a region of interest within the examination region and resulting in an aliased image of the region of interest;

exciting the spatially encoded MR active nuclei;

receiving r.f. signals from the excited MR active nuclei, the step of receiving r.f. signals including the use of a first r.f. receive coil and a second r.f. receive coil; and processing the spatially encoded r.f receive signals to produce a spatial representation of the region of interest, the step of processing including the use of the r.f. signals received from the first and second r.f. receive coils together with sensitivity information for the first and second r.f. receive coils to produce an unfolded image of the aliased image, wherein the sensitivity information used is arranged to be collected at reduced resolution compared to that at which the image is collected.

9. A method as claimed in claim 8, in which the sensitivity information of the first and second r.f. receive coils is produced using a lower value of maximum phase-encode gradient than that used for collecting the image information.

10. A method as claimed in claim 8, in which the sensitivity information of the first and second r.f. receive coils is collected a plurality of times and averaged.

11. A method as claimed in claim 8, in which the sensitivity information is obtained by ratioing the sensitivities of the first and second r.f. receive coils.

12. A method as claimed in claim 11, in which the first r.f receive coil is a loop coil and the second r.f. receive coil is a butterfly coil.

13. A method as claimed in claim 11, in which the first r.f. receive coil is a body coil.

14. A method as claimed in claim 11, in which the first and second r.f. receive coils are disposed at opposite sides of the examination region from one another.

* * * * *